(12) United States Patent
McKinley et al.

(10) Patent No.: US 11,131,564 B2
(45) Date of Patent: Sep. 28, 2021

(54) COMPONENT IDENTIFICATION

(71) Applicant: Caterpillar Inc., Peoria, IL (US)

(72) Inventors: Michael T. McKinley, Washington, IL (US); Ye Tian, Bloomington, IL (US)

(73) Assignee: Caterpillar Inc., Peoria, IL (US)

(*) Notice: Subject to any disclaimer, the term of this patent is extended or adjusted under 35 U.S.C. 154(b) by 0 days.

(21) Appl. No.: 16/796,628

(22) Filed: Feb. 20, 2020

(65) Prior Publication Data

US 2021/0262830 A1   Aug. 26, 2021

(51) Int. Cl.
*G01D 5/14*   (2006.01)
(52) U.S. Cl.
CPC ................... *G01D 5/145* (2013.01)
(58) Field of Classification Search
CPC ...................................................... G01D 5/145
See application file for complete search history.

(56) References Cited

U.S. PATENT DOCUMENTS

| | | | |
|---|---|---|---|
| 4,845,411 A | 7/1989 | Smith | |
| 5,226,256 A | 7/1993 | Fries | |
| 7,196,515 B2 * | 3/2007 | Roessler | G01D 5/142 324/207.2 |
| 9,349,943 B2 | 5/2016 | Röhrer | |
| 2005/0270021 A1 | 12/2005 | Roessler | |
| 2017/0200028 A1 | 7/2017 | Deak et al. | |
| 2017/0340996 A1 | 11/2017 | Jo et al. | |
| 2019/0369174 A1 * | 12/2019 | Corbett | G06K 19/06196 |

FOREIGN PATENT DOCUMENTS

| | | |
|---|---|---|
| CN | 201218156 Y | 4/2009 |
| CN | 201608680 | 10/2010 |
| CN | 207420765 U | 5/2018 |
| CN | 108885808 A | 11/2018 |
| CN | 109962651 | 7/2019 |
| CN | 110030129 A | 7/2019 |
| EP | 2774685 B1 | 7/2019 |
| WO | 2016004372 A1 | 1/2016 |

* cited by examiner

*Primary Examiner* — Clayton E. LaBalle
*Assistant Examiner* — Michael A Harrison
(74) *Attorney, Agent, or Firm* — Harrity & Harrity LLP

(57) ABSTRACT

A component identification system is disclosed. The component identification system may include a sensor system that includes a first Hall-effect switch configured to provide a first output signal corresponding to a state of the first Hall-effect switch, and a second Hall-effect switch configured to provide a second output signal corresponding to a state of the second Hall-effect switch. The sensor system may be configured to provide a single output signal that is based on the first output signal and the second output signal and indicates a combined state of the first Hall-effect switch and the second Hall-effect switch. The component identification system may include a component that is to be identified. The component may include a first magnet configured to affect the state of the first Hall-effect switch and a second magnet configured to affect the state of the second Hall-effect switch.

20 Claims, 4 Drawing Sheets

COMPONENT IDENTIFICATION

TECHNICAL FIELD

The present disclosure relates generally to component identification and, for example, to component identification using Hall-effect switches.

BACKGROUND

Machines include a number of components that work in coordination to perform various operations in the machine. Some of these components may need to be replaced at some stage of machine operation due to wear, reaching an end of a useful life, and/or the like. Such components may be a target for counterfeiters that may manufacture duplicate components that are poorly designed or otherwise inferior. Accordingly, these duplicate components may not meet the standards for original components (e.g., as set by original equipment manufacturers (OEMs)), and may result in poor performance, damage to the machine and related accessories, low user satisfaction with the machine, and/or the like.

One attempt at a magnetic anti-counterfeit label and identification system is disclosed in U.S. Patent Application Publication No. 20170200028 ("the '028 publication"). In particular, the '028 publication discloses a magnetic anti-counterfeit label that includes a magnetic ink layer, and the magnetic ink layer may be a character printed using magnetic ink. The '028 publication states that the magnetic anti-counterfeit label generates a magnetic field, and a magnetic sensor senses a gradient of a magnetic field component of the magnetic field emitted by the magnetic anti-counterfeit label. Specifically, the '028 publication indicates that by using magnetic characters, the magnitude of the magnetic field emitted by the characters is sensed. In addition, the '028 patent indicates that the magnetic sensor transmits a sensed signal to a digital processing circuit, and the digital processing circuit outputs a code corresponding to the magnetic anti-counterfeit label according to the received signal.

While the identification system of the '028 publication may employ a magnetic sensor and a digital processing circuit to identify a magnetic anti-counterfeit label, the '028 publication does not indicate that the digital processing circuit uses a single logical output signal for identification. Rather, the '028 publication indicates that the signal used by the digital processing circuit relates to a magnitude of a magnetic field. Such a signal may require significant time and processing resources to interpret, and may introduce complexities into an identification system that may result in system failures, false positives, false negatives, and/or the like.

The component identification system of the present disclosure solves one or more of the problems set forth above and/or other problems in the art.

SUMMARY

According to some implementations, a component identification system may include: a sensor system that includes a first Hall-effect switch configured to provide a first output signal corresponding to a state of the first Hall-effect switch, and a second Hall-effect switch configured to provide a second output signal corresponding to a state of the second Hall-effect switch, the sensor system configured to provide a single output signal that is based on the first output signal and the second output signal and indicates a combined state of the first Hall-effect switch and the second Hall-effect switch; and a component that is to be identified, the component including a first magnet configured to affect the state of the first Hall-effect switch and a second magnet configured to affect the state of the second Hall-effect switch.

According to some implementations, a component identification module may include: a sensor system that includes a first Hall-effect switch configured to provide a first output signal corresponding to a state of the first Hall-effect switch, and a second Hall-effect switch configured to provide a second output signal corresponding to a state of the second Hall-effect switch, the sensor system configured to provide a single output signal that is based on the first output signal and the second output signal and indicates a combined state of the first Hall-effect switch and the second Hall-effect switch; and a controller configured to identify a component within a threshold proximity of the sensor system based on the single output signal.

According to some implementations, a method may include causing an input voltage to be supplied to a sensor system that includes a first Hall-effect switch configured to provide a first output signal corresponding to a state of the first Hall-effect switch and a second Hall-effect switch configured to provide a second output signal corresponding to a state of the second Hall-effect switch; and receiving, from the sensor system, a single output voltage that is based on the first output signal and the second output signal and that indicates a combined state of the first Hall-effect switch and the second Hall-effect switch.

DETAILED DESCRIPTION

This disclosure relates to a component identification system. The component identification system has universal applicability to any machine utilizing one or more components that may be replaced over a life of the machine. The term "machine" may refer to any machine that performs an operation associated with an industry such as, for example, mining, construction, farming, transportation, or any other industry. As some examples, the machine may be a vehicle, a backhoe loader, a cold planer, a wheel loader, a compactor, a feller buncher, a forest machine, a forwarder, a harvester, an excavator, an industrial loader, a knuckleboom loader, a material handler, a motor grader, a pipelayer, a road reclaimer, a skid steer loader, a skidder, a telehandler, a tractor, a dozer, a tractor scraper, or other above ground equipment, underground equipment, or marine equipment.

Figure 1:
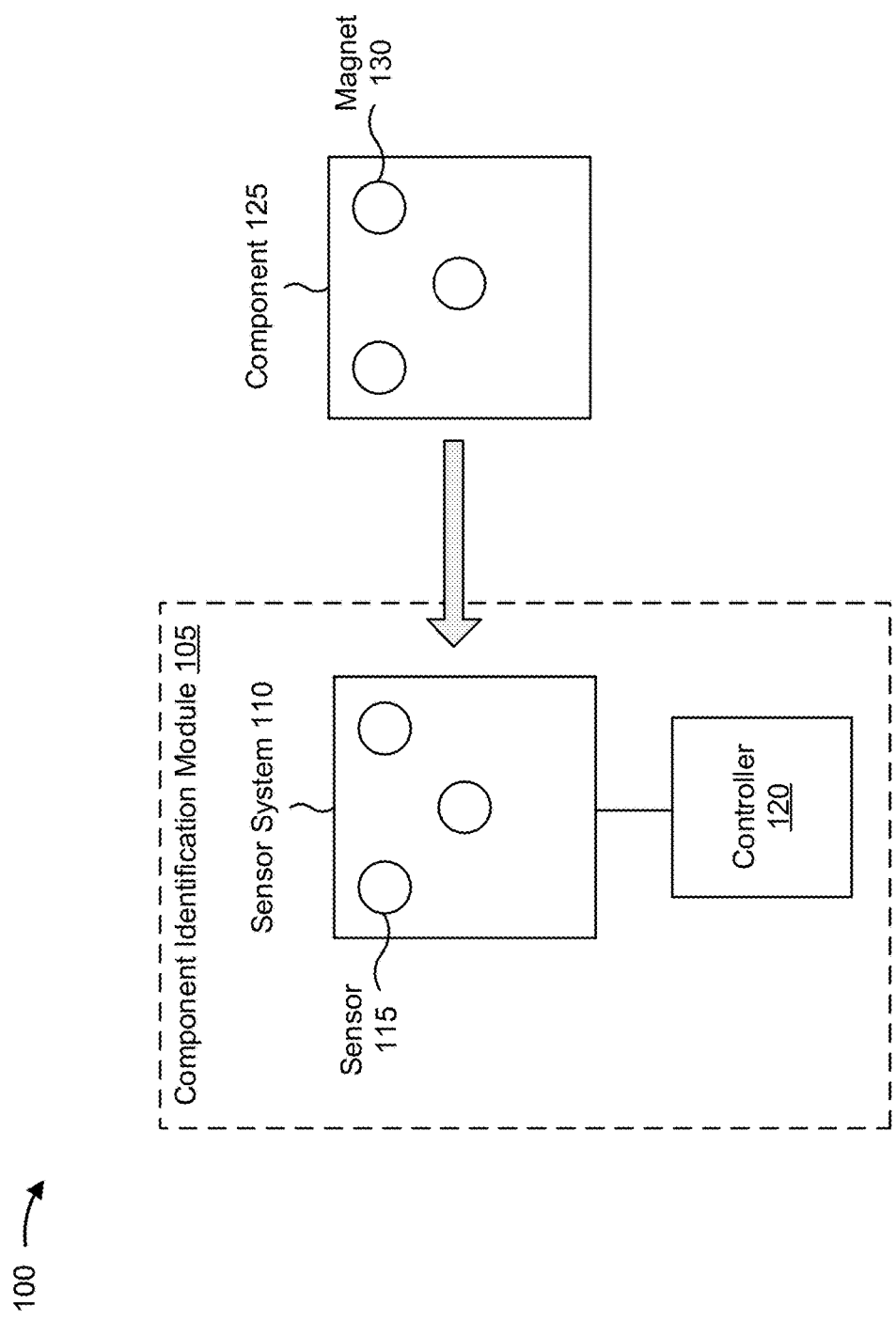
FIG. 1 is a diagram of an example component identification system.

FIG. 1 is a diagram of an example component identification system 100. As shown in FIG. 1, the component identification system 100 includes a component identification module 105. The component identification module 105 includes a sensor system 110 and a controller 120. The sensor system 110 includes one or more sensors 115 configured to detect a magnetic field (e.g., one or more Hall-effect sensors, as described in connection with FIGS. 2-4). The sensors 115 may be arranged in the sensor system 110 in a particular configuration. The particular configuration of the sensors 115 may include locations of the sensors 115, spacings between the sensors 115, a quantity of sensors 115, and/or the like.

The particular configuration of the sensors 115 corresponds to a particular configuration of one or more magnets 130 in a component 125 (e.g., a filter, a battery, a tire, and/or the like, of a machine) that is to be identified by the component identification module 105. The particular configuration of the magnets 130 may include locations of the magnets 130, spacings between the magnets 130, a quantity of magnets 130, polarities of the magnets 130, and/or the like. Accordingly, the magnets 130 may be configured to affect respective states of the sensors 115. For example, when the component 125 is brought within a threshold proximity (e.g., 10 millimeters (mm), 5 mm, or 1 mm) of the sensor system 110, such as during component replacement or installation, each of the sensors 115 that align with a respective magnet 130 may produce a detection state. That is, a sensor 115 may produce the detection state when a magnet 130 is within the threshold distance of the sensor 115.

The sensor system 110 may output, to the controller 120, a single output signal that is based on a detection state (or absence of a detection state) of the sensors 115 (i.e., rather than outputting respective signals from each sensor 115). For example, the sensor system 110 may output a first output signal when one or more of the sensors 115 and one or more of the magnets 130 align, and may output a second output signal when one or more of the sensors 115 and one or more of the magnets 130 do not align. In some implementations, the sensor system 110 (e.g., using one or more of the sensors 115 and/or other circuitry) may alter the output signal before the output signal is output to the controller 120. For example, the sensor system 110 may amplify the output signal, modulate the output signal, or convert the output signal to another signal type. As an example, the sensor system 110 may convert the output signal to a pulse width modulation (PWM) signal before the output signal is received by the controller 120.

The output signal may indicate a logical true output or a logical false output, which is identified by the controller 120 as a positive identification of the component 125 or a negative identification of the component 125, respectively. A positive identification of the component 125 may indicate that the component 125 is attached to a machine or a device associated with the component identification module 105, that the component 125 is properly installed, that the component 125 is an authorized component, that the component 125 is a particular component, and/or the like.

The controller 120 may be an electronic control module (ECM) of a machine. The controller 120 may include one or more memories and one or more processors that implement operations associated with component identification. For example, the controller 120 may be configured to cause an input voltage to be supplied to the sensor system 110, receive, from the sensor system 110, the single output voltage, and identify a component (e.g., component 125) based on the single output voltage.

In some implementations, based on a positive or a negative identification of the component 125, the controller 120 may perform one or more actions. For example, the controller 120 may transmit a notification (e.g., to a user device) or update a display (e.g., of a machine or a device associated with the component identification module 105) to identify whether the identification was positive or negative, identify one or more features of the component 125, identify a remaining useful life of the component 125, and/or the like. As another example, the controller 120 may enable (e.g., in a case of a positive identification) or disable (e.g., in a case of a negative identification) one or more features or capabilities of a machine or a device associated with the component identification module 105.

As indicated above, FIG. 1 is provided as an example. Other examples may differ from what is described in connection with FIG. 1.

Figure 2:
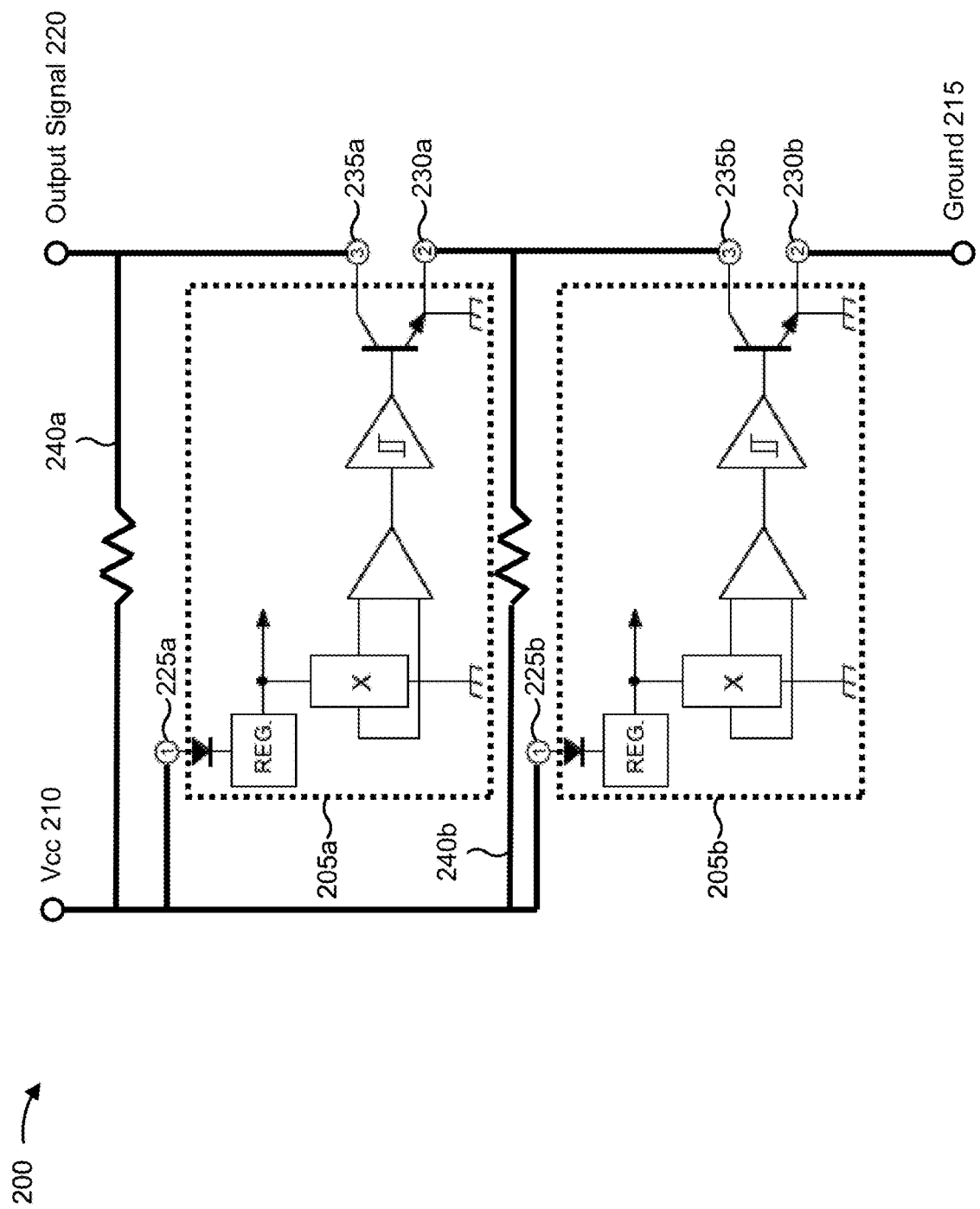
FIGS. 2-4 are diagrams of example sensor systems that may be used with the component identification system of FIG. 1.

FIG. 2 is a diagram of an example sensor system 200 that may be used with the component identification system 100 of FIG. 1. For example, the sensor system 200 may correspond to the sensor system 110. As shown in FIG. 2, the sensor system 200 may include a first Hall-effect switch 205a and a second Hall-effect switch 205b. The Hall-effect switches 205 may be included in a circuit that is connected to a supply voltage (Vcc) 210 (e.g., 5 volts (V)) and a ground potential 215 (e.g., 0 V), and that provides an output signal 220.

The Hall-effect switches 205 may be three-terminal Hall-effect switches. For example, the Hall-effect switches 205 may have respective input terminals 225a, 225b for receiving a first reference potential (e.g., supply voltage 210), respective ground terminals 230a, 230b for receiving a second reference potential, and respective output terminals 235a, 235b for providing an output signal.

As shown in FIG. 2, the first Hall-effect switch 205a and the second Hall-effect switch 205b may be connected in series. For example, the output terminal 235b of the second Hall-effect switch 205b may be connected to the ground terminal 230a of the first Hall-effect switch 205a. In addition, the ground terminal 230b of the second Hall-effect switch 205b may be connected to the ground potential 215 and the output terminal 235a of the first Hall-effect switch 205a may provide the output signal 220. While FIG. 2 shows two Hall-effect switches connected in this manner, in some implementations, more than two Hall-effect switches may be connected. For example, an output terminal of a successive Hall-effect switch may be connected to a ground terminal of the preceding Hall-effect switch.

The first Hall-effect switch 205a may be configured to provide a first output signal (e.g., voltage) corresponding to a state of the first Hall-effect switch 205a, and the second Hall-effect switch 205b may be configured to provide a second output signal (e.g., voltage) corresponding to a state of the second Hall-effect switch 205b. The state of a Hall-effect switch 205 may indicate whether the Hall-effect switch 205 has detected a magnetic field (e.g., when the Hall-effect switch 205 is within a threshold proximity, that is, a particular distance, of a magnet of a component, such as component 125). For example, when a magnetic field is detected, a Hall-effect switch 205 may be in a first state (e.g., a detection state) that causes the Hall-effect switch 205 to output a first voltage that satisfies a first threshold value (e.g., a low voltage below the threshold value, such as 200 millivolts (mV), which is below the supply voltage 210). Alternatively, when a magnetic field is not detected, a Hall-effect switch 205 may be in a second state that causes the Hall-effect switch 205 to output a second voltage that satisfies a second threshold value (e.g., a high voltage above the threshold value, such 5 V, which corresponds to the supply voltage 210) greater than the first threshold value.

In some implementations, the sensor system 200 may include a first resistor 240a that connects the supply voltage 210 and the first output signal off of the output terminal 235a of the first Hall-effect switch 205a, and a second resistor 240b that connects the supply voltage 210 and the second output signal off of the output terminal 235b of the second Hall-effect switch 205*b*. The resistors 240 may have a resistance that causes the first voltage to be greater than 0 V (and less than the first threshold value), such as 200 mV. This enables differentiation between detection of a magnetic field and another event that may result in a 0 V output, such as a malfunction of the sensor system 200, a loss of power to the sensor system 200, and/or the like.

The first Hall-effect switch 205*a* may receive the second output signal of the second Hall-effect switch 205*b* (e.g., because the output terminal 235*b* is connected to the ground terminal 230*a*). Accordingly, the first output signal of the first Hall-effect switch 205*a* may depend upon the second output signal of the second Hall-effect switch 205*b*. For example, if a magnetic field is not detected by the second Hall-effect switch 205*b*, then the second Hall-effect switch 205*b* outputs the second voltage (e.g., the high voltage corresponding to the supply voltage 210). In this way, there is no voltage difference across the first Hall-effect switch 205*a* from input terminal 225*a* to ground terminal 230*a*, which disables the first Hall-effect switch 205*a* from detecting magnetic fields. As another example, if a magnetic field is detected by the second Hall-effect switch 205*b*, then the second Hall-effect switch 205*b* outputs the first voltage (e.g., the low voltage). In this way, there is a voltage difference across the first Hall-effect switch 205*a*, which enables the first Hall-effect switch 205*a* to detect magnetic fields.

When the first Hall-effect switch 205*a* is enabled to detect magnetic fields (e.g., because the second Hall-effect switch 205*b* detected a magnetic field), the first Hall-effect switch 205*a* outputs the first voltage (e.g., the low voltage) if the first Hall-effect switch 205*a* detects a magnetic field, and outputs the second voltage (e.g., the high voltage corresponding to the supply voltage 210) if the first Hall-effect switch 205*a* does not detect a magnetic field. Otherwise, when the first Hall-effect switch 205*a* is disabled from detecting magnetic fields (e.g., because the second Hall-effect switch 205*b* did not detect a magnetic field), the first Hall-effect switch 205*a* outputs the second voltage (e.g., the high voltage corresponding to the supply voltage 210).

Accordingly, the output signal 220 corresponds to the first output signal of the first Hall-effect switch 205*a*, which is dependent upon the second output signal of the second Hall-effect switch 205*b*. In this way, the output signal 220 is a single output signal based on the first output signal of the first Hall-effect switch 205*a* and the second output signal of the second Hall-effect switch 205*b*. Moreover, the output signal 220 indicates a combined state of the first Hall-effect switch 205*a* and the second Hall-effect switch 205*b*. For example, the combined state indicates whether the first Hall-effect switch 205*a* and the second Hall-effect switch 205*b* detected magnetic fields.

The output signal 220 may indicate a logical true output of the sensor system 200 when the output signal 220 is the first voltage (e.g., when the first output signal of the first Hall-effect switch 205*a* is the first voltage), and the output signal 220 may indicate a logical false output of the sensor system 200 when the output signal 220 is the second voltage (e.g., when the first output signal of the first Hall-effect switch 205*a* is the second voltage). The output signal 220 is the first voltage (e.g., the low voltage) when the first output signal of the first Hall-effect switch 205*a* and the second output signal of the second Hall-effect switch 205*b* are the first voltage, and the output signal 220 is the second voltage (e.g., the high voltage) when at least one of the first output signal of the first Hall-effect switch 205*a* or the second output signal of the second Hall-effect switch 205*b* is the second voltage. Thus, the configuration of the sensor system 200 may be referred to as an "AND" configuration.

As indicated above, FIG. 2 is provided as an example. Other examples may differ from what is described in connection with FIG. 2.

Figure 3:
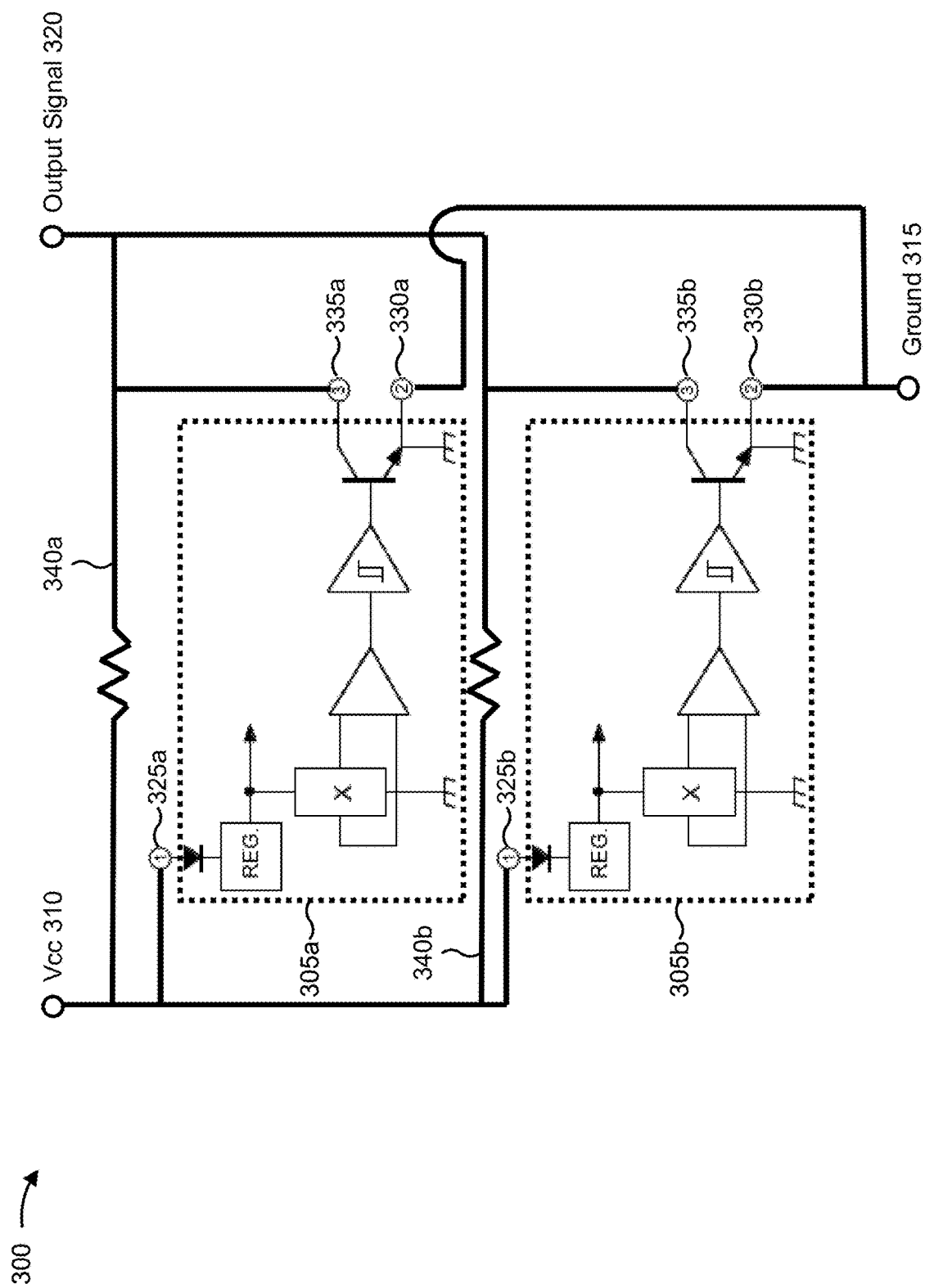

FIG. 3 is a diagram of an example sensor system 300 that may be used with the component identification system 100 of FIG. 1. For example, the sensor system 300 may correspond to the sensor system 110. As shown in FIG. 3, the sensor system 300 may include a first Hall-effect switch 305*a* and a second Hall-effect switch 305*b*. The Hall-effect switches 305 may be included in a circuit that is connected to a supply voltage (Vcc) 310 (e.g., 5 V) and a ground potential 315 (e.g., 0 V), and that provides an output signal 320.

The Hall-effect switches 305 may be three-terminal Hall-effect switches, as described in connection with FIG. 2. For example, the Hall-effect switches 305 may include respective input terminals 325*a*, 325*b*, respective ground terminals 330*a*, 330*b*, and respective output terminals 335*a*, 335*b*.

As shown in FIG. 3, the first Hall-effect switch 305*a* and the second Hall-effect switch 305*b* may be connected in parallel. For example, the output terminal 335*a* of the first Hall-effect switch 305*a* and the output terminal 335*b* of the second Hall-effect switch 305*b* may be tied together. In addition, the ground terminal 330*a* of the first Hall-effect switch 305*a* and the ground terminal 330*b* of the second Hall-effect switch 305*b* may be tied together. While FIG. 3 shows two Hall-effect switches connected in this manner, in some implementations, more than two Hall-effect switches may be connected. For example, output terminals of one or more additional Hall-effect switches may be tied together with output terminals 335*a*, 335*b*, and ground terminals of the additional Hall-effect switches may be tied together with ground terminals 330*a*, 330*b*.

The first Hall-effect switch 305*a* may be configured to provide a first output signal (e.g., voltage) corresponding to a state of the first Hall-effect switch 305*a*, and the second Hall-effect switch 305*b* may be configured to provide a second output signal (e.g., voltage) corresponding to a state of the second Hall-effect switch 305*b*, as described in connection with FIG. 2. For example, when a magnetic field is detected, a Hall-effect switch 305 may output the first voltage (e.g., the low voltage), and when a magnetic field is not detected, a Hall-effect switch 305 may output the second voltage (e.g., the high voltage corresponding to the supply voltage 310). In some implementations, the sensor system 300 may include a first resistor 340*a* and a second resistor 340*b*, as described in connection with FIG. 2.

The first output signal of the first Hall-effect switch 305*a* may be combined with the second output signal of the second Hall-effect switch 305*b* (e.g., because the output terminals 335*a*, 335*b* are tied together) to provide the output signal 320. Accordingly, the output signal 320 is a single output signal based on the first output signal of the first Hall-effect switch 305*a* and the second output signal of the second Hall-effect switch 305*b*. Moreover, the output signal 320 indicates a combined state of the first Hall-effect switch 305*a* and the second Hall-effect switch 305*b*. For example, the combined state indicates whether at least one of the first Hall-effect switch 305*a* or the second Hall-effect switch 305*b* detected a magnetic field.

The output signal 320 may indicate a logical true output of the sensor system 300 when the output signal 320 is the first voltage, and the output signal 320 may indicate a logical false output of the sensor system 300 when the output signal 320 is the second voltage. The output signal 320 is the first voltage (e.g., the low voltage) when at least one of the first output signal of the first Hall-effect switch 305a or the second output signal of the second Hall-effect switch 305b is the first voltage, and the output signal 320 is the second voltage (e.g., the high voltage) when both of the first output signal of the first Hall-effect switch 305a and the second output signal of the second Hall-effect switch 305b are the second voltage. Thus, the configuration of the sensor system 300 may be referred to as an "OR" configuration.

As indicated above, FIG. 3 is provided as an example. Other examples may differ from what is described in connection with FIG. 3.

Figure 4:
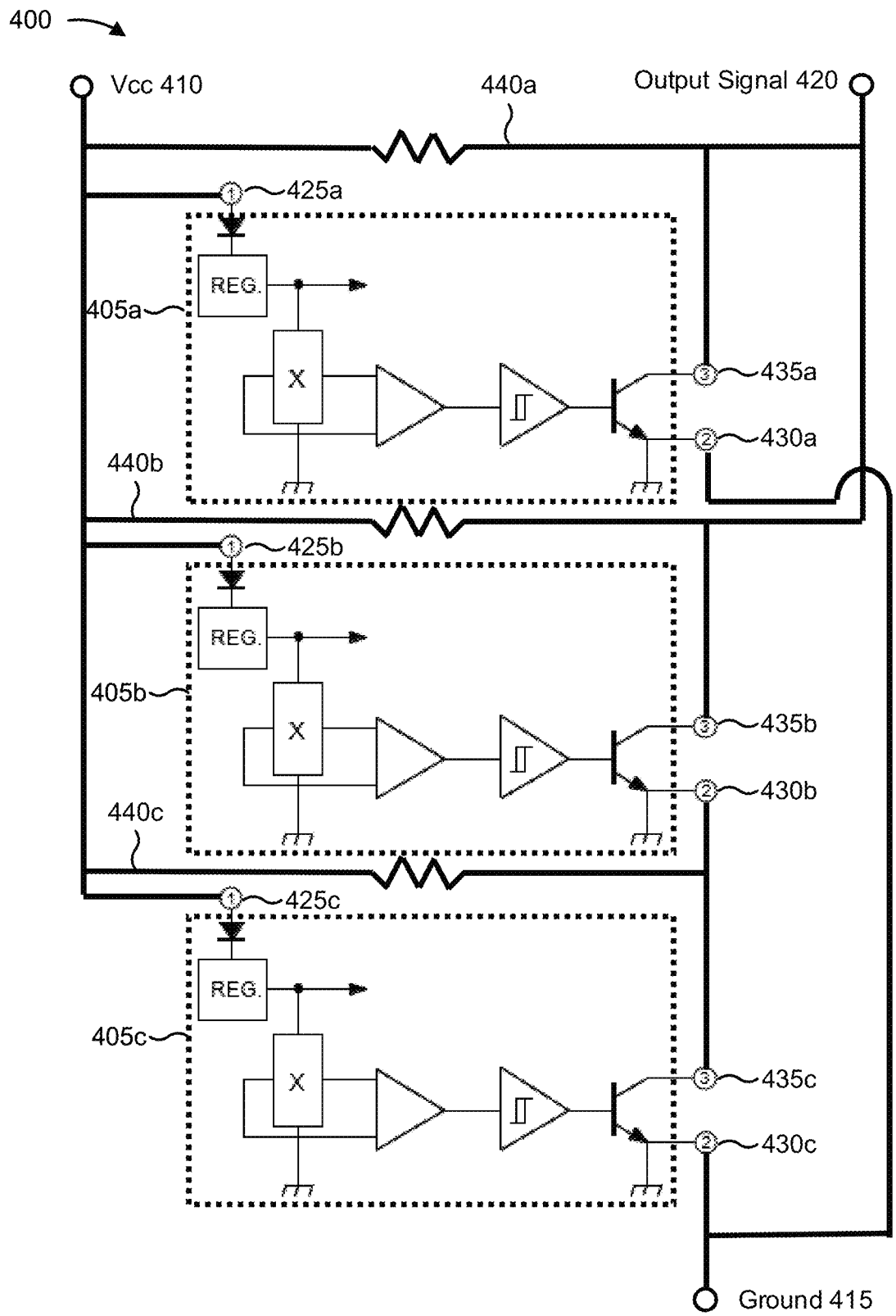

FIG. 4 is a diagram of an example sensor system 400 that may be used with the component identification system 100 of FIG. 1. For example, the sensor system 400 may correspond to the sensor system 110. As shown in FIG. 4, the sensor system 400 may include a first Hall-effect switch 405a, a second Hall-effect switch 405b, and a third Hall-effect switch 405c. The Hall-effect switches 405 may be included in a circuit that is connected to a supply voltage (Vcc) 410 (e.g., 5 V) and a ground potential 415 (e.g., 0 V), and that provides an output signal 420.

The Hall-effect switches 405 may be three-terminal Hall-effect switches, as described in connection with FIG. 2. For example, the Hall-effect switches 405 may include respective input terminals 425a, 425b, 425c, respective ground terminals 430a, 430b, 430c, and respective output terminals 435a, 435b, 435c.

As shown in FIG. 4, the second Hall-effect switch 405b and the third Hall-effect switch 405c may be connected in series (e.g., an AND configuration), as described in connection with FIG. 2, and the first Hall-effect switch 405a and the second Hall-effect switch 405b may be connected in parallel (e.g., an OR configuration), as described in connection with FIG. 3. While FIG. 4 shows three Hall-effect switches connected in this manner, in some implementations, more than three Hall-effect switches may be connected in a combination of AND configurations and OR configurations.

The first Hall-effect switch 405a may be configured to provide a first output signal (e.g., voltage) corresponding to a state of the first Hall-effect switch 405a, the second Hall-effect switch 405b may be configured to provide a second output signal (e.g., voltage) corresponding to a state of the second Hall-effect switch 405b, and the third Hall-effect switch 405c may be configured to provide a third output signal (e.g., voltage) corresponding to a state of the third Hall-effect switch 405c, as described in connection with FIG. 2. For example, when a magnetic field is detected, a Hall-effect switch 405 may output the first voltage (e.g., the low voltage), and when a magnetic field is not detected, a Hall-effect switch 405 may output the second voltage (e.g., the high voltage corresponding to the supply voltage 410). In some implementations, the sensor system 400 may include a first resistor 440a, a second resistor 440b, and a third resistor 440c, as described in connection with FIG. 2.

The second Hall-effect switch 405b may receive the third output signal of the third Hall-effect switch 405c (e.g., because the output terminal 435c is connected to the ground terminal 430b). Accordingly, the second output signal of the second Hall-effect switch 405b may depend upon the third output signal of the third Hall-effect switch 405c, as described in connection with FIG. 2. Moreover, the first output signal of the first Hall-effect switch 405a may be combined with the second output signal of the second Hall-effect switch 405b (e.g., because the output terminals 435a, 435b are tied together) to provide the output signal 420.

Accordingly, the output signal 420 is a single output signal based on the first output signal of the first Hall-effect switch 405a, the second output signal of the second Hall-effect switch 405b, and the third output signal of the third Hall-effect switch 405c. Moreover, the output signal 420 indicates a combined state of the first Hall-effect switch 405a, the second Hall-effect switch 405b, and the third Hall-effect switch 405c. For example, the combined state indicates whether the first Hall-effect switch 405a or at least one of the second Hall-effect switch 405b or the third Hall-effect switch 405c detected a magnetic field.

The output signal 420 may indicate a logical true output of the sensor system 400 when the output signal 420 is the first voltage, and the output signal 420 may indicate a logical false output of the sensor system 400 when the output signal 420 is the second voltage. The output signal 420 is the first voltage (e.g., the low voltage) when the first output signal of the first Hall-effect switch 405a is the first voltage or the second output signal of the second Hall-effect switch 405b and the third output signal of the third Hall-effect switch 405c are the first voltage. The output signal 420 is the second voltage (e.g., the high voltage) when the first output signal of the first Hall-effect switch 405a is the second voltage and at least one of the second output signal of the second Hall-effect switch 405b or the third output signal of the third Hall-effect switch 405c is the second voltage. Thus, the configuration of the sensor system 400 may be referred to as an "AND/OR" configuration.

As indicated above, FIG. 4 is provided as an example. Other examples may differ from what is described in connection with FIG. 4.

INDUSTRIAL APPLICABILITY

The disclosed component identification system 100 may be used with any machine or device having one or more components that may be replaced. The component identification system 100 may employ a sensor system 110 that detects whether a component 125 includes an array of magnets 130 in an identifiable configuration. For example, the sensor system 110 may include an array of Hall-effect switches that are arranged in a particular configuration corresponding to an arrangement of an array of magnets 130 in a known component 125. Accordingly, when the component 125 is installed in the machine or the device, a controller 120 of the component identification system 100 may identify the component 125 based on a correspondence between the array of Hall-effect switches and the array of magnets 130. This enables differentiation between authentic components and counterfeit components.

Moreover, the sensor system 110 provides a single logical output (e.g., true or false) indicating whether a component 125 has been identified. Accordingly, complex sensor/magnet configurations may be used without individual polling of each sensor. Such individual polling in complex configurations requires extra computing resources, increases power usage, and is more susceptible to errors, such as false positives or false negatives. Thus, the sensor system 110 provides component identification with improved efficiency and accuracy.

As used herein, the articles "a" and "an" are intended to include one or more items, and may be used interchangeably with "one or more." Also, as used herein, the terms "has," "have," "having," or the like are intended to be open-ended terms. Further, the phrase "based on" is intended to mean "based, at least in part, on."

The foregoing disclosure provides illustration and description, but is not intended to be exhaustive or to limit the implementations to the precise form disclosed. Modifications and variations may be made in light of the above disclosure or may be acquired from practice of the implementations. It is intended that the specification be considered as an example only, with a true scope of the disclosure being indicated by the following claims and their equivalents. Even though particular combinations of features are recited in the claims and/or disclosed in the specification, these combinations are not intended to limit the disclosure of various implementations. Although each dependent claim listed below may directly depend on only one claim, the disclosure of various implementations includes each dependent claim in combination with every other claim in the claim set.

What is claimed is:

1. A component identification system, comprising:
   a sensor system that includes:
      a first Hall-effect switch configured to provide a first output signal corresponding to a state of the first Hall-effect switch;
      a second Hall-effect switch configured to provide a second output signal corresponding to a state of the second Hall-effect switch,
         the sensor system configured to provide a single output signal that is based on the first output signal and the second output signal and indicates a combined state of the first Hall-effect switch and the second Hall-effect switch; and
   a component that is to be identified based on the single output signal,
      the component including a first magnet configured to affect the state of the first Hall-effect switch and a second magnet configured to affect the state of the second Hall-effect switch,
      the single output signal being a first voltage indicating a logical true output when at least one of the first magnet or the second magnet is within a threshold proximity of the first Hall-effect switch or the second Hall-effect switch, or a second voltage indicating a logical false output when at least one of the first magnet or the second magnet is not within the threshold proximity of the first Hall-effect switch or the second Hall-effect switch, and
   the single output signal being the first voltage when at least one of the first output signal or the second output signal is the first voltage.

2. The component identification system of claim 1, wherein the first Hall-effect switch and the second Hall-effect switch are connected in series.

3. The component identification system of claim 1, wherein the second output signal is to be received by the first Hall-effect switch such that the first output signal is dependent upon the second output signal, and
   wherein the single output signal corresponds to the first output signal.

4. The component identification system of claim 1, wherein the first Hall-effect switch and the second Hall-effect switch are connected in parallel.

5. The component identification system of claim 1, wherein the first output signal and the second output signal are to be combined to provide the single output signal.

6. The component identification system of claim 1, wherein the single output signal is to be the first voltage when the first output signal and the second output signal are the first voltage, and
   wherein the single output signal is to be the second voltage when at least one of the first output signal or the second output signal is the second voltage.

7. The component identification system of claim 1, wherein the single output signal is to be the second voltage when the first output signal and the second output signal are the second voltage.

8. The component identification system of claim 1, further comprising:
   a third Hall-effect switch configured to provide a third output signal corresponding to a state of the third Hall-effect switch,
      wherein the third output signal is to be received by the second Hall-effect switch such that the second output signal is dependent upon the third output signal, and
      wherein the second output signal is to be combined with the first output signal to provide the single output signal.

9. The component identification system of claim 8, wherein the second Hall-effect switch and the third Hall-effect switch are connected in series, and the first Hall-effect switch and the second Hall-effect switch are connected in parallel.

10. The component identification system of claim 8, wherein the single output signal is to be the first voltage when the first output signal is the first voltage or the second output signal and the third output signal are the first voltage, and
    wherein the single output signal is to be the second voltage when the first output signal is the second voltage and at least one of the second output signal or the third output signal is the second voltage.

11. A component identification module, comprising:
    a sensor system that includes:
       a first Hall-effect switch configured to provide a first output signal corresponding to a state of the first Hall-effect switch; and
       a second Hall-effect switch configured to provide a second output signal corresponding to a state of the second Hall-effect switch,
       a third Hall-effect switch configured to provide a third output signal corresponding to a state of the third Hall-effect switch,
          the third output signal being received by the second Hall-effect switch such that the second output signal is dependent upon the third output signal, and
          the sensor system configured to provide a single output signal that is based on the first output signal and the second output signal and indicates a combined state of the first Hall-effect switch and the second Hall-effect switch; and
    a controller configured to identify a component within a threshold proximity of the sensor system based on the single output signal.

12. The component identification module of claim 11, wherein the state of the first Hall-effect switch indicates detection of a magnetic field when the first Hall-effect switch is within a particular distance of a first magnet of the component, and
    wherein the state of the second Hall-effect switch indicates detection of a magnetic field when the second Hall-effect switch is within the particular distance of a second magnet of the component.

13. The component identification module of claim 11, wherein the combined state of the first Hall-effect switch and the second Hall-effect switch indicates whether the first Hall-effect switch and the second Hall-effect switch detected magnetic fields.

14. The component identification module of claim 11, wherein the combined state of the first Hall-effect switch and the second Hall-effect switch indicates whether at least one of the first Hall-effect switch or the second Hall-effect switch detected a magnetic field.

15. The component identification module of claim 11, wherein the second output signal is to be received by the first Hall-effect switch such that the first output signal is dependent upon the second output signal, and
wherein the single output signal corresponds to the first output signal.

16. The component identification module of claim 11, wherein the first output signal and the second output signal are to be combined to provide the single output signal.

17. A method, comprising:
causing an input voltage to be supplied to a sensor system that includes a first Hall-effect switch configured to provide a first output signal corresponding to a state of the first Hall-effect switch and a second Hall-effect switch configured to provide a second output signal corresponding to a state of the second Hall-effect switch; and
receiving, from the sensor system, a single output voltage that is based on the first output signal and the second output signal and that indicates a combined state of the first Hall-effect switch and the second Hall-effect switch,
the single output voltage being a first voltage indicating a logical true output when at least one of a first magnet or a second magnet is within a threshold proximity of the first Hall-effect switch or the second Hall-effect switch, or a second voltage indicating a logical false output when at least one of the first magnet or the second magnet is not within the threshold proximity of the first Hall-effect switch or the second Hall-effect switch, and
the single output voltage being the first voltage when at least one of the first output signal or the second output signal is the first voltage.

18. The method of claim 17, further comprising:
identifying a component that is in proximity of the sensor system based on the single output voltage.

19. The method of claim 17, wherein the second output signal is dependent upon a third output signal that is provided by a third Hall-effect switch and corresponds to a state of the third Hall-effect switch.

20. The method of claim 17, wherein the first Hall-effect switch and the second Hall-effect switch are connected in series.

* * * * *